(12) United States Patent
Bevk

(10) Patent No.: US 6,406,952 B2
(45) Date of Patent: *Jun. 18, 2002

(54) PROCESS FOR DEVICE FABRICATION

(75) Inventor: Joze Bevk, Summit, NJ (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/902,044

(22) Filed: Jul. 29, 1997

Related U.S. Application Data

(60) Provisional application No. 60/052,440, filed on Jul. 14, 1997.

(51) Int. Cl.[7] .......................................... H01L 21/8238
(52) U.S. Cl. ....................... 438/199; 438/582; 438/592; 438/649; 438/651; 438/682; 438/683; 438/201
(58) Field of Search ................................. 438/199, 201, 438/592, 582, 651, 649, 683, 682

(56) References Cited

U.S. PATENT DOCUMENTS

| | | | |
|---|---|---|---|
| 4,753,895 A | 6/1988 | Mayer et al. | 437/21 |
| 4,816,893 A | 3/1989 | Mayer et al. | 357/42 |
| 5,081,066 A | * 1/1992 | Kim | |
| 5,147,820 A | * 9/1992 | Chittipeddi et al. | |
| 5,355,010 A | * 10/1994 | Fujii et al. | |
| 5,464,789 A | * 11/1995 | Saito | |
| 5,476,800 A | 12/1995 | Burton et al. | 437/126 |
| 5,541,433 A | 7/1996 | Lien | 257/378 |
| 5,550,079 A | 8/1996 | Lin | |
| 5,648,287 A | * 7/1997 | Tsai et al. | |
| 5,712,181 A | * 1/1998 | Byun et al. | |
| 5,723,356 A | 3/1998 | Tsukamoto | |
| 5,759,886 A | * 6/1998 | Chung | |
| 5,770,494 A | * 6/1998 | Yamamoto et al. | |
| 5,851,922 A | * 12/1998 | Bevk et al. | |

FOREIGN PATENT DOCUMENTS

| | | |
|---|---|---|
| EP | 0722190 | 7/1996 |
| JP | 60007180 | 1/1985 |
| JP | 09022999 | 7/1995 |
| JP | 08031931 | 2/1996 |
| JP | 09051040 | 2/1997 |

OTHER PUBLICATIONS

S. Wolf and R.N. Tauber, Silicon Processing for the VLSI era, V1, pp. 397–398, 1986.*
S.M. Sze, VLSI Technology, 2nd edition, pp. 483–484, 1988.*
A. Nishiyama et al., A Themally Stable salicide Process Using N2 Implantation Into TiSi2, pp. 310–316, (IEEE), 1990.*

* cited by examiner

Primary Examiner—Long Pham
Assistant Examiner—Scott Brairton
(74) Attorney, Agent, or Firm—Scott J. Rittman

(57) ABSTRACT

A process for device fabrication, comprising the steps of forming a dielectric material region on a silicon substrate, forming a first amorphous silicon or polysilicon region on the dielectric material region, implanting one or more dopants in the first amorphous silicon or polysilicon region, and, subsequent to implanting the one or more dopants in the first amorphous silicon or polysilicon region, forming a second amorphous silicon or polysilicon region on the first amorphous silicon or polysilicon region. Typically, a refractory metal silicide layer is formed over the silicon, and such silicide is optionally formed by a salicide process. The second silicon region makes it more difficult for the implanted dopants to reach the silicide layer, and thereby reduces undesirable lateral diffusion of dopants in the silicide and accompanying cross-doping. The buried nature of the dopants in the silicon further reduces the amount of lateral diffusion within the silicon, regardless of the gate material. In addition, the benefits of a relatively thin gate dielectric are realized. Further, the reduced annealing times and temperatures necessary for dopant drive-in and activation result in improved control of device threshold voltage, on- and off-current, and channel and source/drain dopant profiles.

20 Claims, 4 Drawing Sheets

PROCESS FOR DEVICE FABRICATION

This application claims priority of Provisional Application Ser. No. 60/052,440, entitled Process for Device Fabrication, filed Jul. 14, 1997.

BACKGROUND OF THE INVENTION

1. Field of the Invention

The invention relates to fabrication of integrated circuits.

2. Discussion of the Related Art

A variety of applications utilize CMOS (Complimentary Metal Oxide Semiconductor) integrated circuits. Many CMOS integrated circuits contain a dual-gate structure, illustrated in part by FIG. 7. Typically, formation of a dual-gate structure begins by forming a gate dielectric region 108 over a silicon substrate 100 having an n-doped region 102 and a p-doped region 104. (A dielectric material is an electrically insulating material, i.e., a material having a resistivity of about $10^6$ ohm-cm or greater.) A field dielectric 106 is also formed to isolate the oppositely-doped regions of the device. A polysilicon region 110 is typically deposited over the gate dielectric 108 and field dielectric 106. The portion of the polysilicon 110 overlying the n-doped region 102 is provided with a p-type dopant such as boron or $BF_2$, and the portion of the polysilicon 110 overlying the p-doped region 104 is provided with an n-type dopant such as phosphorus or arsenic. Such dual-gate CMOS configurations typically contain a refractory metal silicide layer 112 (or other metal layer) over the doped polysilicon, the refractory metal silicide acting to lower resistance in the gate structure and thereby improve device and circuit performance.

However, n-type and p-type dopants tend to diffuse more readily in refractory metal silicides than in polysilicon. Dopants thus tend to diffuse, for example, from a region of the polysilicon 110 overlying doped silicon region 102 into the suicide layer 112, laterally in the silicide layer 112, and then back into the polysilicon 110 at a region overlying the oppositely-doped region 104. Thus, n-type dopants move into a p-doped polysilicon region and vice versa. The phenomenon is referred to herein as cross-doping. Diffusion of these cross-dopants into the area of the polysilicon adjacent to the underlying gate dielectric causes undesirable shifts in threshold voltage, an important parameter in CMOS design and operation. Moreover, the problem of cross-doping is becoming more severe as the industry moves toward smaller CMOS devices, e.g., moving towards 0.25 $\mu$m length devices, and even more significantly toward 0.18 $\mu$m and lower. The smaller the devices, the larger the effect of cross-dopants on properties such as threshold voltage, and the closer the devices, the less distance the dopants have to laterally travel to interfere with adjacent devices.

Problems are also created by the distribution of dopants in the implanted regions of the polysilicon 110. Advantageously, the implanted dopants in the final device are located near the underlying gate dielectric 108. Typically, however, the majority of dopants lie close to the top of the polysilicon 110, and an anneal is used to diffuse the dopants toward the gate dielectric 108. However, the anneal time and temperature required to diffuse the dopants across this distance will often undesirably allow diffusion of some of the dopants laterally within the polysilicon 110 into an oppositely-doped region of the polysilicon 110, causing cross-doping. This lateral diffusion within the polysilicon 110 is a problem regardless of whether a silicide layer is present. This mechanism of cross-doping is particularly problematic where half the distance between the active regions of adjacent devices becomes comparable to the thickness of the doped regions of the polysilicon 110. In addition, the use of thinner gate dielectric layers improves device performance, but only where a relatively large concentration of dopants, advantageously about $10^{20}$ dopants/$cm^3$ or greater, is located adjacent to the gate dielectric (resulting in what is known in the art as low poly-depletion). If sufficient dopants are not located adjacent to the dielectric layer, the use of a thinner gate dielectric will at best only marginally improve device performance.

It is also possible for dopant distribution to cause problems when forming a refractory metal silicide by a salicide process. In a typical salicide process, a refractory metal is deposited after formation of a polysilicon gate structure, a source and drain, and silicon dioxide spacers. The device is heated to react the metal with the silicon, thereby forming a refractory metal silicide. Due to a low level of bonding between the refractory metal and the silicon dioxide spacers, the silicide typically does not form on the spacers, leading to what is conventionally known as self-alignment of the silicide structure. Growth of the silicide layer in such a salicide process is detrimentally affected if too many dopants, or dopant-based precipitates, are located in the top region of the polysilicon gate structure, where the silicide is formed. In addition, because the polysilicon region is typically thicker when using a salicide process, the dopant diffusion distance to the gate dielectric is often increased, thereby allowing encroachment of the underlying channel region that often leads to shorts in the device.

For these reasons, a process that places dopants deep within the polysilicon layer is desired. Such a deep implant is difficult to attain, however. Typically, as mentioned above, the majority of dopants will lie close to the top surface of the polysilicon regions. It is difficult to implant dopants deeper in the polysilicon without encountering undesirable effects. For example, it is possible for dopants, particularly boron, to penetrate the polysilicon during ion implantation and move into the underlying silicon substrate, or to move along certain crystallographic orientations of polysilicon—a phenomenon known as channeling. (Both mechanisms are referred to herein generally as penetration.) The presence of the boron in the channel region of the silicon substrate detrimentally affects the threshold voltage. Thus, implantation is performed at energies low enough to reduce penetration. Yet, where lower implantation energies are used, the concentration profile will often not be deep enough to avoid the problems discussed above.

Thus, improved processes which address problems created by cross-doping and by certain dopant concentration profiles, particularly in smaller, dual-gate CMOS devices, are desired.

SUMMARY OF THE INVENTION

The process of the invention addresses problems of cross-doping, and of undesirable dopant concentration profiles, found in current CMOS fabrication processes, and is also applicable to smaller devices. In an embodiment of the invention, devices are prepared by forming a first, relatively thin (e.g., about 300–1000 Å) amorphous silicon region over a gate dielectric material region formed over n-type and p-type regions of a silicon substrate. It is also possible to use polysilicon. (The term amorphous indicates a lack of long-range order.) An n-type dopant is implanted at a first portion of the first amorphous silicon region, typically over the p-type region of the substrate. The n-type dopant is advantageously implanted such that substantially all of the dopant remains in the first amorphous silicon region and does not penetrate into the underlying dielectric region or the substrate. "Substantially all" indicates that no more than about 0.001% of the implanted dopant penetrates into the underlying dielectric layer or substrate during implantation. This result is attained, for example, by use of a low energy ion implantation method, e.g., implanting arsenic at 2–30 keV or phosphorus at 1–20 keV. A p-type dopant species is then implanted at a second portion of the first amorphous silicon region, typically over the n-type region of the substrate. Again, it is advantageous for substantially all of the p-type dopant species to remain in the first amorphous silicon region. It is possible for this result to be similarly attained by use of low energy ion implantation, e.g., implanting boron at 0.25–5 keV.

Once the desired dopants are implanted into the first silicon region, a second amorphous silicon (or polysilicon) region is formed over the first silicon region, in essence burying the implanted dopants. Typically, a refractory metal silicide layer is formed over the second amorphous silicon region. Devices are then formed on the structure in accordance with conventional processing techniques known to one skilled in the art. The creation of the buried implant layer is significant in that the buried nature of the dopants hinders cross-doping that occurs through the silicide. For example, in order for such detrimental cross-doping to occur, the dopant must diffuse from the p-doped region of the first amorphous silicon region into and through the second amorphous silicon region into the metal silicide layer, diffuse laterally within the silicide layer to the area over the oppositely-doped amorphous silicon region, diffuse back through the second amorphous silicon region into the opposite-doped region of the first amorphous silicon region, and move through the first amorphous silicon region to an area along the underlying gate dielectric.

In addition, because the dopants are implanted in a relatively thin layer formed on the gate dielectric, the diffusion distance to the gate dielectric is relatively low. Thus, dopants are able to diffuse to the area adjacent to the gate dielectric without substantial lateral diffusion in the silicon or substantial reduction in the channel. Similarly, the process of the invention provides for a relatively high concentration of dopants at and near the gate dielectric, thereby allowing advantageous use of a thin gate dielectric. Furthermore, due to the buried nature of the dopants, there is typically little interference by dopants with a salicide process.

Advantageously, the process of the invention also includes a subsequent rapid thermal anneal in which the wafer is heated to about 900 to about 1050° C. for a time of about 2 to about 10 seconds. (Rapid thermal anneal indicates a process that uses a heat source such as high-powered quartz filaments, which provide a fast increase in temperature, e.g., 100–200° C./sec, and in which the measured temperature is that of the silicon wafer.) The rapid thermal anneal is useful in attaining a desirable distribution of dopants in the doped regions of the device and in helping to activate the dopants. (The term activate indicates that the dopants become electrically active by moving to the proper sites in the silicon lattice (substituting for silicon atoms as opposed to being located interstitially within the silicon lattice).) The short time of the rapid thermal anneal is desirable, particularly for short length devices, because lateral diffusion in both the gate and the channel region, as well as dopant diffusion through the gate dielectric, is reduced.

Thus, the process of the invention, due to the buried nature of the dopants, provides a relatively simple way of reducing detrimental cross-doping, as well as providing a desirable dopant distribution.

DETAILED DESCRIPTION OF THE INVENTION

The invention relates to a process for fabricating devices, particularly dual-gate CMOS devices. General principles and standard procedures for device fabrication are found, for example, in Van Zant, "Microchip Fabrication," 3d Ed., McGraw-Hill, 1997. It is expected that future processing technology will allow, for example, use of thinner layers and lower implantation energies in the process of the invention, and the concept of the invention is applicable to such future improvements.

Figure 1A:
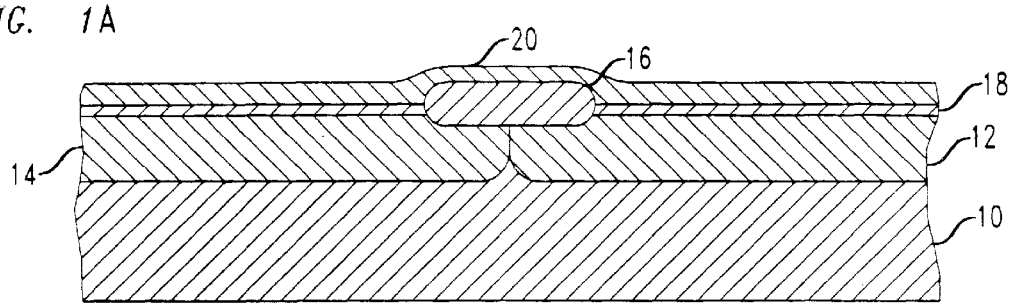
FIGS. 1(a) to 1(d) reflect process steps in an embodiment of the invention.

The process of the invention is illustrated by the embodiment shown in FIGS. 1(a) through 1(d). Devices are fabricated by obtaining or forming a semiconductor substrate 10 having an n-type region 12 and a p-type region 14, as shown in FIG. 1(a). It is possible for these regions to be formed in accordance with standard processing techniques well known to one skilled in the art, such as the twin tub process described in U.S. Pat. No. 4,435,596 to Parillo et al., the disclosure of which is hereby incorporated by reference. A field dielectric 16 is formed on the substrate to separate the n-type region 12 and the p-type region 14, in accordance with standard processing techniques. Field dielectric 16 constitutes, for example, a surface isolation (e.g., LOCOS—localized oxidation of silicon) or a trench isolation (e.g., STI-shallow trench isolation). Typically, the field dielectric 16 is LOCOS isolation and has a thickness of about 2000 to about 3000 Å.

A gate dielectric region 18, typically silicon dioxide, is then formed over the portions of the n-type region 12 and p-type region 14 not covered by the field dielectric 16. The gate dielectric 18 is formed in accordance with standard processing techniques and, when formed from silicon dioxide, is advantageously about 15 to about 100 Å thick. It is possible to consider the combination of the field dielectric 16 and gate dielectric 18 as constituting a dielectric material region. As also shown in FIG. 1(a), a first region of amorphous silicon 20 is then formed on the field dielectric 16 and gate dielectric 18. It is also possible to use polysilicon. Amorphous silicon is advantageous in that it substantially reduces channeling and therefore allows use of thinner layers. Advantageously, the amorphous region 20 has a thickness of about 300 to about 1000 Å. The region 20 is formed in accordance with standard processing techniques known to one skilled in the art, e.g., chemical vapor deposition, as discussed, for example in Van Zant, supra, Chapter 12.

Figure 1B:
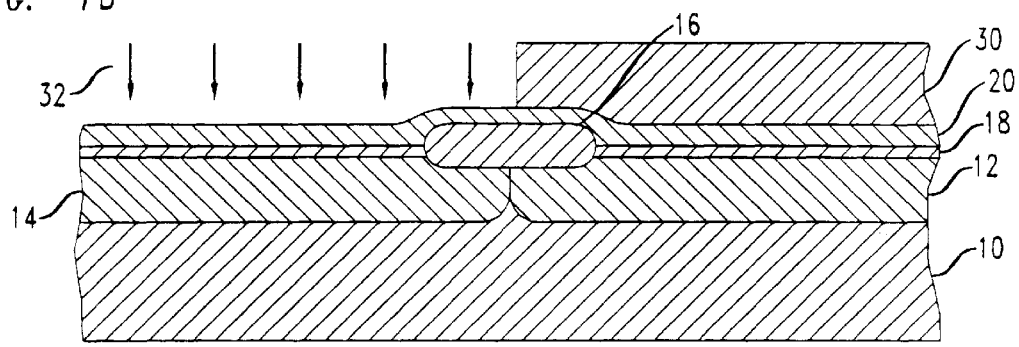

As shown in FIG. 1(b), a mask 30 is then formed over the first amorphous silicon region 20, using standard lithographic techniques known to one skilled in the art. The mask 30 selectively exposes portions of the region 20 that overlay the p-type region 14 of the substrate 10. An n-type dopant 32 is implanted into the exposed portions of the region 20. Suitable n-type dopants include arsenic and phosphorus. The implantation is advantageously performed by ion implantation at an energy that reduces penetration. Advantageous implant energies for arsenic range from about 2 to about 30 keV, and for phosphorus from about 1 to about 20 keV. Useful dopant implant doses for arsenic range from about $1.5 \times 10^{15}$ to about $5 \times 10^{15}$ dopants/cm$^2$, and for phosphorus from about $3 \times 10^{15}$ to about $8 \times 10^{15}$ dopants/cm$^2$. At these energies and doses, implantation is typically performed for a time of a few seconds to a few minutes (e.g., 5 minutes).

Figure 1C:
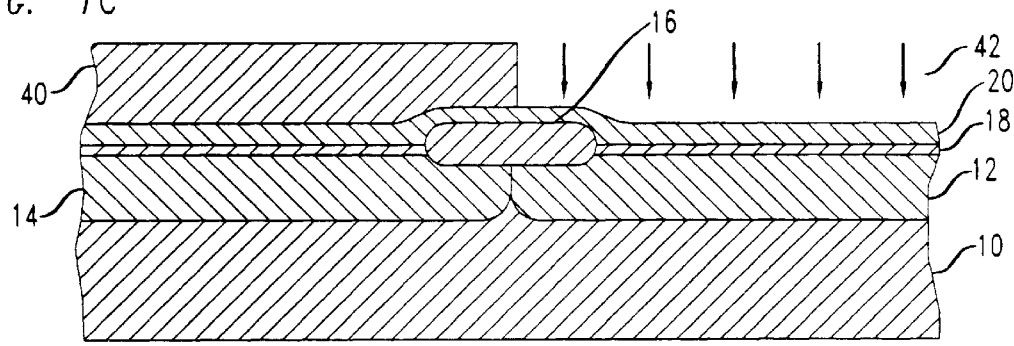

The mask 30 is then removed. Again using standard lithographic techniques, a second mask 40, as shown in FIG. 1(c), is formed over the first amorphous silicon region 20. The mask 40 selectively exposes portions of the region 20 that overlay the n-type region 12 of the substrate 10. A p-type dopant 42 is implanted into the exposed portions of the region 20. Suitable p-type dopants include boron. The implantation of the p-type dopant is also advantageously performed by ion implantation at an implant energy that reduces penetration. Advantageously, the implantation of boron is performed at about 0.25 to about 5 keV, and at dopant implant doses of about $1.5 \times 10^{15}$ to about $4 \times 10^{15}$ dopants/cm$^2$. At these energies and doses, implantation is typically performed for a time of a few seconds to a few minutes (e.g., 5 minutes). Boron typically requires more time for implantation than n-type dopants.

The energy and dopant dose selected for both n-type and p-type dopants depend in part on the thickness of the amorphous silicon region 20. In general, it is possible to use higher implant energies and doses with thicker layers without resulting in unwanted penetration.

Figure 1D:
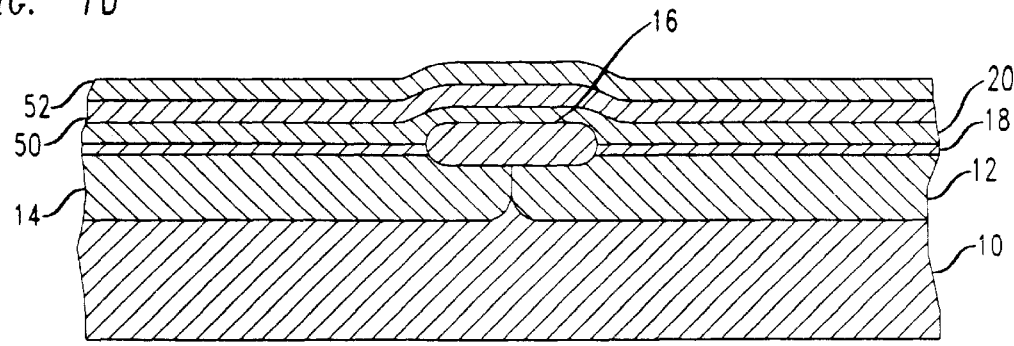

The mask 40 is then removed, and, as shown in FIG. 1(d), a second amorphous silicon region 50 is formed over the now-implanted first amorphous silicon region 20. It is also possible to use polysilicon. Amorphous silicon is advantageous because diffusion of dopants is generally slower in recrystallized amorphous silicon than in deposited polysilicon. Advantageously, the second amorphous region 50 has a thickness of about 200 to about 1000 Å. The second region 50 is formed in accordance with standard processing techniques known to one skilled in the art, e.g., chemical vapor deposition.

A refractory metal silicide layer 52 is optionally formed on the second amorphous silicon region 50 by standard processing techniques known to one skilled in the art, e.g., sputtering or chemical vapor deposition. Examples of suitable refractory metal silicides include tungsten silicide, tantalum silicide, and cobalt silicide. Advantageously, the refractory metal silicide layer 52 has a thickness of about 800 to about 2000 Å. It is also advantageous for the process of the invention to include a step of introducing nitrogen into the refractory metal silicide layer. Where the nitrogen is ion implanted, the implantation advantageously is performed at an energy of about 10–50 keV (depending on the thickness), more advantageously 30 keV, and at a dopant implant dose of about $1 \times 10^{15}$ to about $2 \times 10^{15}$ atoms/cm$^2$. The nitrogen appears to trap boron atoms in the suicide layer, and thus assists in reducing lateral diffusion and cross-doping of boron.

It is also possible to form a silicide layer by a salicide process. Metal layers other than refractory metal silicides are also possible.

Advantageously, an anneal is performed after formation of the second amorphous silicon region 50 to recrystallize the second amorphous silicon region 50 and first amorphous silicon region 20, i.e., transform the regions 50, 20 into polysilicon. It is possible for the anneal to be performed after formation of the second silicon region 50, after formation of the silicide layer 52, or after a nitrogen implant of the silicide layer 52. The anneal is advantageously performed at a temperature of about 580 to about 650° C., for about 1 to about 5 hours, in a nitrogen atmosphere. More advantageously, the anneal is performed at about 650° C. for about 3 hours in a nitrogen atmosphere.

The resulting structure is then subjected to processing steps to form gate stacks over the n-regions and p-regions of the substrate, in accordance with standard procedures known to one skilled in the art. Advantageously, such steps include a rapid thermal anneal after formation of gate stacks. The rapid thermal anneal is advantageously performed such that the wafer is raised to a temperature of about 900 to about 1050° C. for a time of about 2 to about 10 seconds. More advantageously, the wafer is raised to a temperature of 1000° C. for 5 seconds. The rapid thermal anneal is useful in attaining a desirable distribution of dopants in the doped regions of the device and in helping to activate the dopants.

Typical processing steps subsequent to formation and implantation of refractory silicide layer 52 would include the following:

Deposit of a gate hard mask. The mask is formed, for example, from silicon oxide deposited by plasma-enhanced deposition of tetraethyl orthosilicate (PETEOS), a nitride layer formed by plasma-enhanced chemical vapor deposition (PECVD), or a spin-on glass (SOG) layer;

Formation of a gate photoresist to allow selective etching of the gate hard mask, etching of the hard mask, and removal of the photoresist;

Etching of refractory silicide layer 52 and first and second silicon regions 20, 50;

Formation of a photoresist to allow implantation of a low-doped drain region (LDD), implanting of the LDD, and removal of the photoresist;

Deposit of a dielectric, e.g., silicon oxide by PETEOS, for gate spacer formation, anneal of the dielectric, and etch of the spacers;

Formation of a photoresist to allow implantation of n-type source and drain, implanting the n-type source and drain, and removal of the photoresist;

Formation of a photoresist to allow implantation of p-type source and drain, implanting the p-type source and drain, and removal of the photoresist.

The rapid thermal anneal is advantageously performed subsequent to implantation of the p-type source and drain. Where a salicide process is used, the process is typically performed subsequent to formation of the n-type and p-type source and drain, and the rapid thermal anneal is typically performed prior to depositing the refractory metal on the polysilicon gate structure.

The invention will be further clarified by the following examples, which are intended to be exemplary.

EXAMPLE 1

Figure 2:
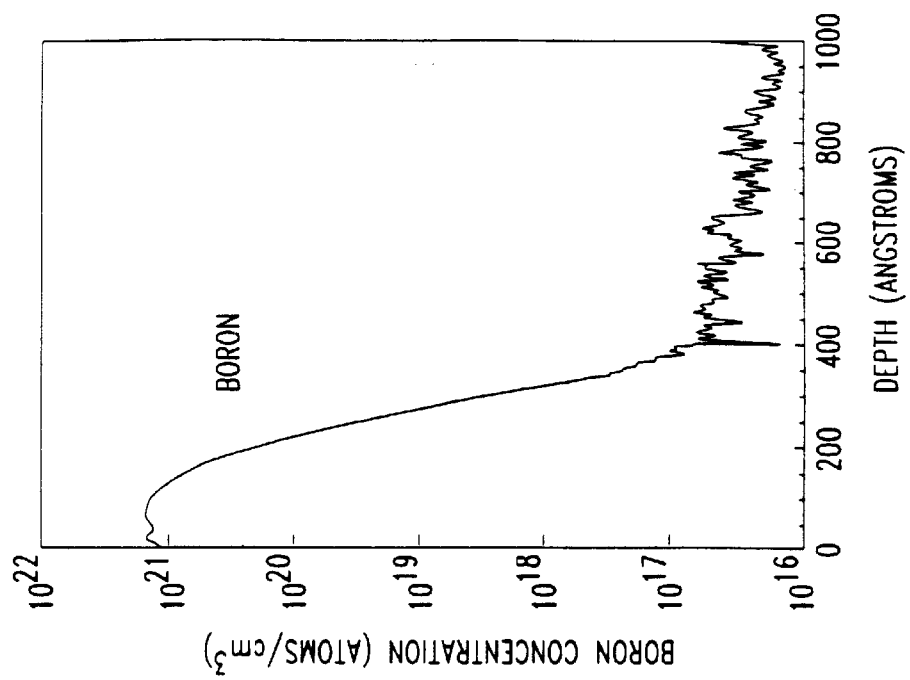
FIGS. 2–4 show dopant distribution profiles for arsenic, boron, and phosphorus, respectively, implanted in an amorphous silicon region in accordance with an embodiment of the process of the invention.
Figure 3:
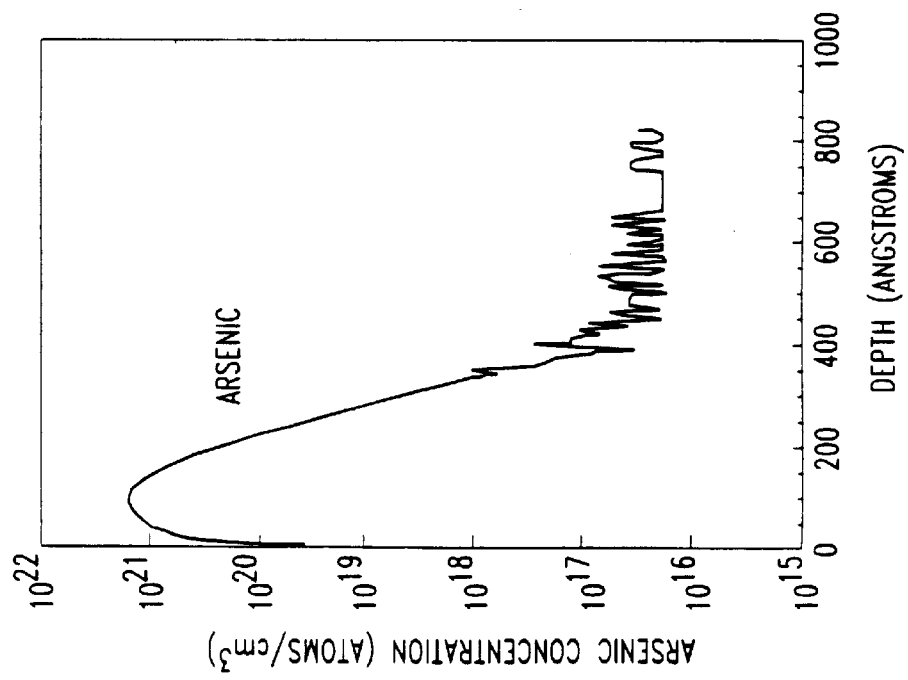

A silicon wafer was processed using conventional expedients, well known to one skilled in the art, to form a silicon substrate having lightly doped n-type and p-type regions. A 2000 Å thick LOCOS field dielectric region was grown on a selected portion of the substrate by dry/wet/dry oxidation to electrically isolate the n-type and p-type regions. A 60 Å gate dielectric layer of silicon oxynitride was formed on the portions of the substrate not covered by the LOCOS region by thermal oxidation in $N_2O$ at 850° C. A 500 Å thick layer of amorphous silicon was formed over the field and gate dielectric layers by low pressure chemical vapor deposition. A layer of photoresist, in accordance with standard practice, was formed on the silicon and structured to expose portions of the silicon overlying the lightly doped p-type region of the substrate. The exposed portions were then implanted with arsenic at 8 keV and a dosage of $2.5 \times 10^{15}$ atoms/$cm^2$. The photoresist was removed, and a second photoresist layer was formed to expose portions of the silicon region overlying the lightly doped n-type region of the substrate. The exposed portions were then implanted with boron at 2 keV and a dosage of $2 \times 10^{15}$ atoms/$cm^2$. The implant profile of arsenic, measured by SIMS (secondary ion mass spectroscopy), is shown in FIG. 2, and the SIMS implant profile of boron is shown in FIG. 3.

Figure 4:
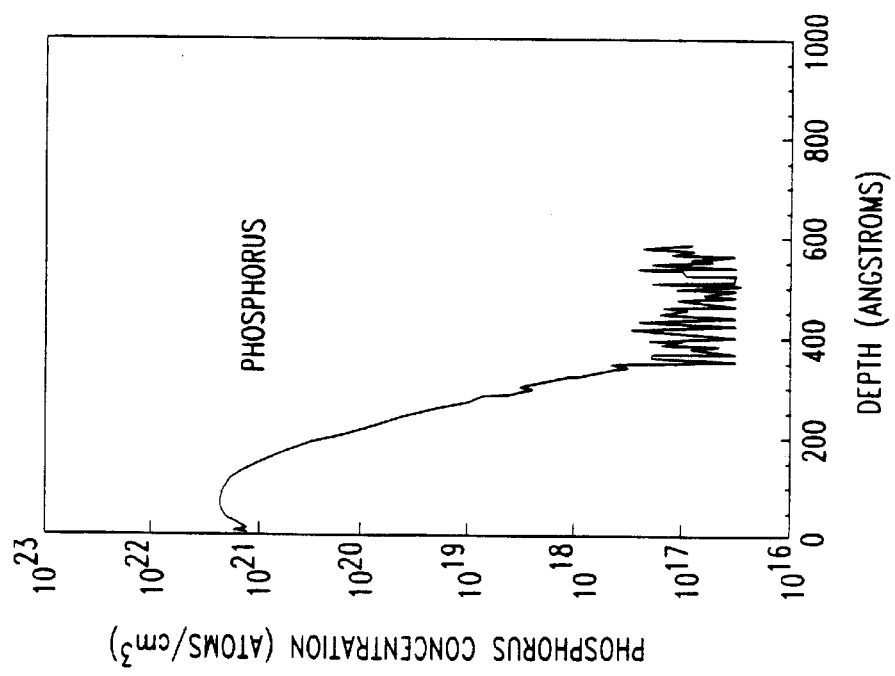

(The implant profile of phosphorus in place of arsenic in an identical embodiment, implanted at 5 keV and a dosage of $4 \times 10^{15}$ atoms/$cm^2$, is shown in FIG. 4.)

EXAMPLE 2

Figure 5:
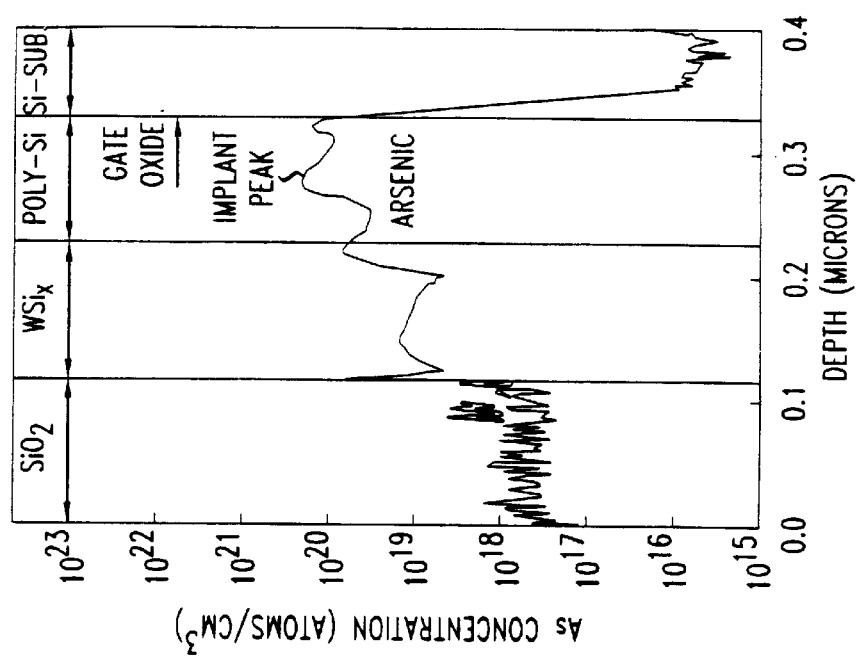
FIGS. 5 and 6 show dopant distribution profiles for arsenic, and boron and nitrogen, respectively, implanted in an amorphous silicon region in accordance with an embodiment of the process of the invention, where numerous processing steps were performed subsequent to dopant implantation.
Figure 6:
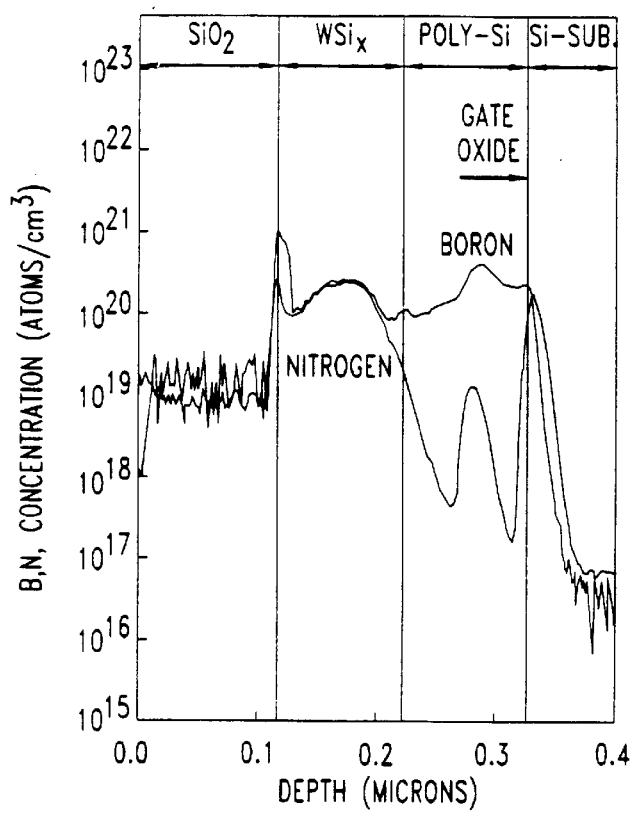
Figure 7:
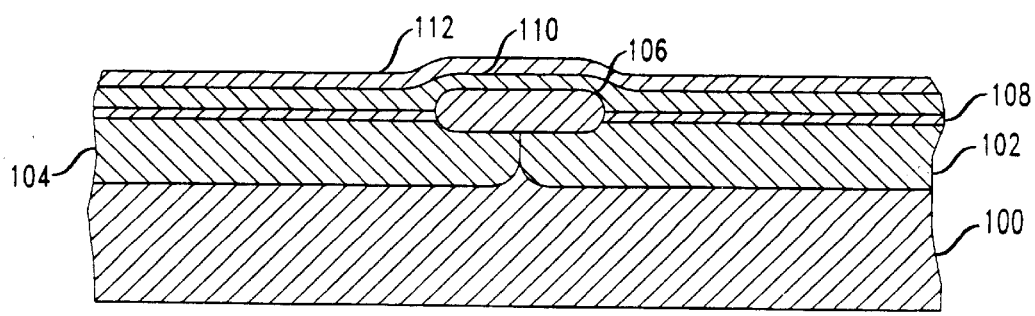
FIG. 7 illustrates a prior art process for forming a dual-gate structure.

A silicon wafer was processed according to the steps of Example 1, using dopants of arsenic and boron. After implantation, a second amorphous silicon region having a thickness of 500 Å was formed by low pressure chemical vapor deposition. An anneal was then performed at 650° C. for 3 hours in nitrogen atmosphere to crystallize the amorphous silicon. After the anneal, a 1000 Å tungsten silicide layer was formed on the second amorphous silicon region by sputtering, and nitrogen was implanted into the silicide at 30 keV and a dosage of $1 \times 10^{15}$ atoms/$cm^2$. In accordance with the standard processing steps discussed above, gate stacks were formed. Specifically, a 1500 Å silicon dioxide hard mask was formed on the silicide layer by PETEOS; the hard mask was etched; the silicide and silicon regions were etched; a low-doped drain region of arsenic was implanted; a silicon dioxide layer was formed for gate spacers and the spacers were etched; an anneal was performed at 750° C. for 30 minutes in oxygen to densify the silicon dioxide spacers; n-type drain and source were implanted; and p-type drain and source were implanted. Then, a rapid thermal anneal of the wafer was performed, the wafer being heated at 1000° C. for 5 seconds by high-powered quartz filaments. FIGS. 5 and 6 show the subsequent SIMS profiles for the arsenic and boron dopants. FIG. 6 also shows the nitrogen profile.

In FIG. 5, the implant peak for arsenic is visible in the middle of the polysilicon region made up of both the first and second amorphous silicon regions (which were transformed to polysilicon during the 650° C. anneal). Due to the relatively short diffusion distance from the implant peak to the polysilicon/gate oxide interface, the arsenic concentration at the interface is desirably high (about $2 \times 10^{20}$ atoms/$cm^3$). The arsenic concentration decreases toward the tungsten silicide ($WSi_x$) layer, in which the concentration is about one order of magnitude less than at the polysilicon/gate oxide interface. This lesser number of atoms in the silicide is a desirable in that lateral diffusion and associated cross-doping by arsenic atoms will be reduced.

FIG. 6 shows a similar result. The boron concentration is desirably high at the polysilicon/gate oxide interface, and decreases toward the silicide layer. The boron concentration within the tungsten silicide layer also appears to be relatively high. The boron profile strongly corresponds to the nitrogen profile, however, indicating that the nitrogen atoms trapped the boron atoms in the silicide, thereby reducing lateral diffusion and cross-doping by boron atoms.

The quantification of the dopant concentrations in FIGS. 5 and 6 are not accurate in the $SiO_2$ layers.

Other embodiments of the invention will be apparent to those skilled in the art from consideration of the specification and practice of the invention disclosed herein.

what is claimed is:

1. A process for device fabrication involving a dual-gate complementary metal oxide semiconductor device, comprising the steps of:

forming a dielectric material region on a silicon substrate;

forming a first amorphous silicon or polysilicon region directly on the dielectric material region;

implanting an n-type dopant in a first exposed portion of the first amorphous silicon or polysilicon region and implanting a p-type dopant in a second exposed portion of the first amorphous silicon or polysilicon region, wherein the first portion overlies a p-type region of the silicon substrate and the second portion overlies an n-type region of the silicon substrate;

subsequent to implanting the dopants, forming a second amorphous silicon or polysilicon region directly on the first amorphous silicon or polysilicon region; and subsequent to forming the second amorphous silicon or polysilicon region, forming source and drain regions in the silicon substrate.

2. The process of claim 1, wherein the first and second silicon regions are amorphous silicon.

3. The process of claim 1, further comprising the step of forming a refractory metal silicide on at least a portion of the second amorphous silicon or polysilicon region.

4. The process of claim 3, wherein the refractory metal silicide layer is formed by a non-self-aligned technique, wherein the refractory metal silicide is selected from the group consisting of tungsten silicide, tantalum silicide, and cobalt silicide, and further comprising the step of, subsequent to completion of the refractory metal silicide layer formation, implanting nitrogen into the refractory metal silicide layer.

5. The process of claim 4, wherein the nitrogen is ion implanted at about 10 to about 50 keV and at a dose of about $1 \times 10^{15}$ to about $2 \times 10^{15}$ atoms/$cm^2$.

6. The process of claim 1, further comprising the step of performing an anneal subsequent to forming the second amorphous silicon or polysilicon region.

7. The process of claim 6, the anneal is performed at a temperature of about 580 to about 650° C., for about 1 to about 5 hours.

8. The process of claim 1, wherein the first amorphous silicon or polysilicon region is amorphous silicon and has a thickness of about 300 to about 1000 Å.

9. The process of claim 1, wherein the second amorphous silicon or polysilicon region is amorphous silicon and has a thickness of about 200 to about 1000 Å.

10. The process of claim 1, wherein the n-type dopant is selected from arsenic and phosphorus.

11. The process of claim 1, wherein the p-type dopant is boron.

12. The process of claim 3, wherein the refractory metal silicide is selected from tungsten suicide, tantalum silicide, and cobalt silicide.

13. The process of claim 10, wherein the n-type dopant is arsenic and the arsenic is implanted by ion implantation at about 2 to about 30 keV.

14. The process of claim 13, wherein the implantation is performed at a dosage of about $1.5 \times 10^{15}$ to about $5 \times 10^{15}$ atoms/cm$^2$.

15. The process of claim 10, wherein the n-type dopant is phosphorus and the phosphorus is implanted by ion implantation at about 1 to about 20 keV.

16. The process of claim 15, wherein the implantation is performed at a dosage of about $3 \times 10^{15}$ to about $8 \times 10^{15}$ atoms/cm$^2$.

17. The process of claim 11, wherein the boron is implanted by ion implantation at about 0.25 to about 5 keV.

18. The process of claim 17, wherein the implantation is performed at a dosage of about $1.5 \times 10^{15}$ to about $4 \times 10^{15}$ atoms/cm$^2$.

19. The process of claim 17, wherein the implantation is performed for a time of about 5 minutes or less.

20. The process of claim 1, further comprising a step of, subsequent to forming the second amorphous silicon or polysilicon region, performing a rapid thermal anneal at a temperature of about 900 to about 1050° C. for a time of about 2 to about 10 seconds.

* * * * *